(12) United States Patent
Wu et al.

(10) Patent No.: US 9,774,004 B2
(45) Date of Patent: Sep. 26, 2017

(54) LIGHT-EMITTING DEVICES AND METHODS FOR MAKING AND USING THE SAME

(71) Applicant: XI'AN JIAOTONG UNIVERSITY, Xi'an, Shaanxi (CN)

(72) Inventors: Zhaoxin Wu, Xi'an (CN); Yang Dai, Xi'an (CN); Bo Jiao, Xi'an (CN); Xun Hou, Xi'an (CN)

(73) Assignee: XI'AN JIAOTONG UNIVERSITY, Xi'an, Shaanxi (CN)

( * ) Notice: Subject to any disclaimer, the term of this patent is extended or adjusted under 35 U.S.C. 154(b) by 0 days.

(21) Appl. No.: 15/030,037

(22) PCT Filed: Oct. 17, 2013

(86) PCT No.: PCT/CN2013/085419
§ 371 (c)(1),
(2) Date: Apr. 15, 2016

(87) PCT Pub. No.: WO2015/054872
PCT Pub. Date: Apr. 23, 2015

(65) Prior Publication Data
US 2016/0254492 A1    Sep. 1, 2016

(51) Int. Cl.
*H01L 51/52*    (2006.01)
*H01L 51/56*    (2006.01)
(Continued)

(52) U.S. Cl.
CPC ........ *H01L 51/5262* (2013.01); *H01L 51/004* (2013.01); *H01L 51/006* (2013.01);
(Continued)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 7,893,614 B2    2/2011 Kang
2001/0033136 A1    10/2001 Kawase
(Continued)

FOREIGN PATENT DOCUMENTS

CN    1836468 A    9/2006
CN    101978780 A    2/2011
(Continued)

OTHER PUBLICATIONS

Frischeisen, J., et al., "Light extraction from surface plasmons and waveguide modes in an organic light-emitting layer by nanoimprinted gratings," Optics Express, vol. 19, No. S1, pp. A7-A19 (Jan. 3, 2011).
(Continued)

*Primary Examiner* — Quoc Hoang
(74) *Attorney, Agent, or Firm* — Maschoff Brennan

(57) ABSTRACT

Provided are light-emitting devices and methods for making and using the same. The light-emitting device comprises: a transparent substrate (101), a light-extracting polymer layer (102) having one or more elevated regions (104) distributed on a surface of the light-extracting polymer layer (102) facing away from the transparent substrate (101), a first electrode layer, wherein the light-extracting polymer layer (102) is disposed between the first electrode layer and the transparent substrate (101), a second electrode layer and a light-emitting layer disposed between the first electrode layer and the second electrode layer, wherein the light-emitting layer is configured to emit light when voltage is applied between the first electrode and the second electrode layer.

14 Claims, 12 Drawing Sheets

(51) Int. Cl.
*H01L 51/00* (2006.01)
*H01L 51/50* (2006.01)

(52) U.S. Cl.
CPC ...... *H01L 51/0035* (2013.01); *H01L 51/0096* (2013.01); *H01L 51/5209* (2013.01); *H01L 51/5225* (2013.01); *H01L 51/56* (2013.01); *H01L 51/0081* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/303* (2013.01); *H01L 2251/308* (2013.01); *H01L 2251/558* (2013.01); *Y02E 10/549* (2013.01); *Y02P 70/521* (2015.11)

(56) References Cited

U.S. PATENT DOCUMENTS

| | | |
|---|---|---|
| 2006/0176421 A1 | 8/2006 | Utsumi et al. |
| 2011/0012139 A1 | 1/2011 | Yamamoto |
| 2012/0241771 A1 | 9/2012 | Kato et al. |
| 2015/0084005 A1* | 3/2015 | Sista .................. H01L 51/5268 257/40 |

FOREIGN PATENT DOCUMENTS

| | | |
|---|---|---|
| CN | 102694128 A | 9/2012 |
| CN | 103280536 A | 9/2013 |
| JP | 2006269163 A | 10/2006 |

OTHER PUBLICATIONS

Gu, X., et al., "Light-emitting diodes enhanced by localized surface plasmon resonance," Nanoscale Research Letters, vol. 6, No. 1, pp. 1-12 (2011).

Hauss, J., et al., "Metallic Bragg-gratings for light management in organic light-emitting devices," Applied Physics Letters, vol. 99, Issue 10 , pp. 103303-1-103303-3 (2011).

International Search Report and Written Opinion for International Application No. PCT/CN2013/085419, mailed on Jul. 29, 2014.

Koo, W.H., et al., "Light extraction from organic light-emitting diodes enhanced by spontaneously formed buckles," Nature Photonics, vol. 4, No. 4, pp. 222-226 (Feb. 2010).

Li, Y., et al., "Improved light extraction efficiency of white organic light-emitting devices by biomimetic antireflective surfaces," Applied Physics Letters, vol. 96, No. 15, pp. 153305-1-153305-3 (Apr. 2010).

Walheim, S., et al., "Structure Formation via Polymer Demixing in Spin-Cast Films," Macromolecules, vol. 30, No. 17, pp. 4995-5003 (1997).

* cited by examiner

Spin-coating

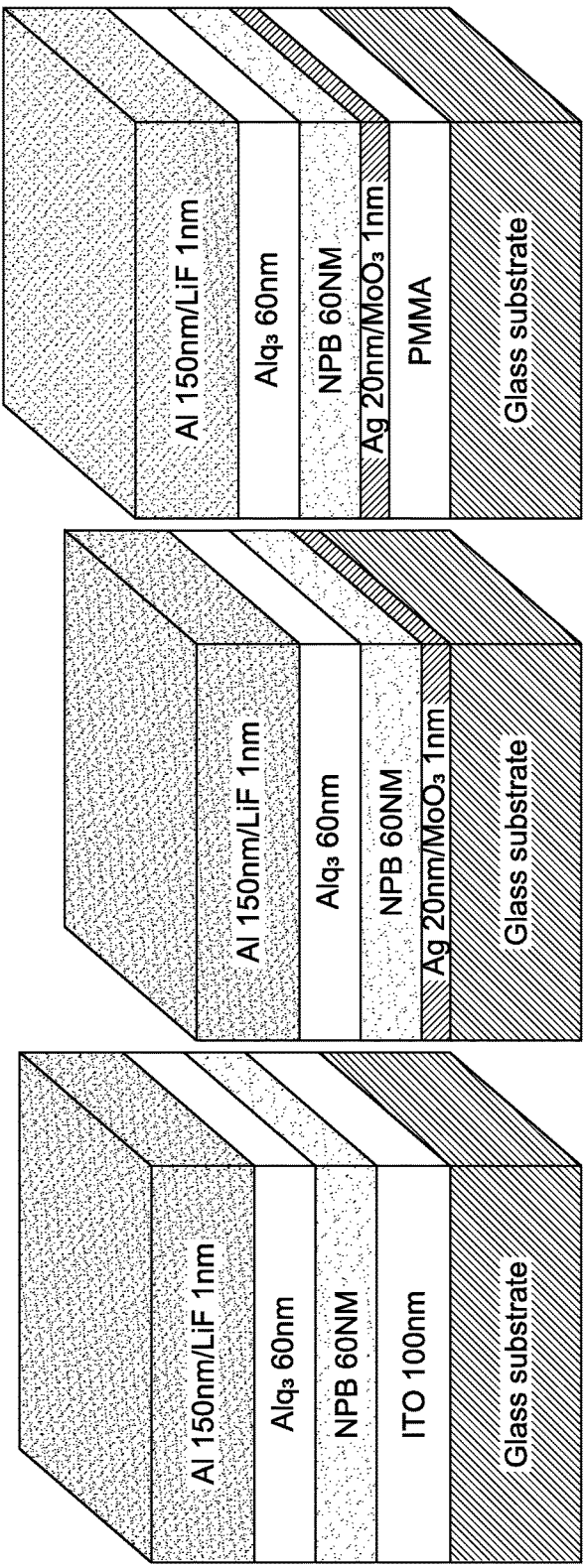

LIGHT-EMITTING DEVICES AND METHODS FOR MAKING AND USING THE SAME

CROSS-REFERENCE TO RELATED APPLICATION

This application is a U.S. National Stage filing under 35 U.S.C. §371 of International Application Serial No. PCT/US2013/085419, filed on Oct. 17, 2013.

BACKGROUND

Light-emitting diodes (LEDs) are optoelectronic devices made by placing a layer of light-emitting material between two electrodes. When a voltage potential is applied to the electrodes and current is injected through the material, visible light is emitted. Due to the high power efficiency, low cost of manufacture, durability and light weight of LEDs, LEDs are often used to create visual displays for portable electronic devices.

In recent years, intensive research and development have been conducted on light-emitting diodes (LEDs) for the realization of high efficiency color display, backlighting and illumination applications. One strategy is to use a metal anode to replace the typically used indium tin oxide (ITO) anode. Conventional organic light-emitting diodes (OLED) use indium tin oxide (ITO) as an anode material. The metal electrodes used for the anode have a number of advantages over the ITO and can have broad applications. For example, the metal anode may be suitable for the flexible substrates and the cost of production can be relatively low. Although power loss in a waveguide in the ITO anode can be eliminated, light may still be trapped in the form of waveguide modes in organic layers and surface plasmon polariton (SPP) modes associated with metal/organic interface within the OLED. The waveguide mode often refers to light trapped in or around the core of the guide, and the SPP modes are infrared or visible frequency electromagnetic waves trapped at metal-dielectric interfaces.

Various Bragg-gratings have been employed in the OLED devices to effectively extract light from the waveguide modes and SPP modes. Various methods have also been attempted to increase the outcoupling efficiency of OLEDs, including substrate modification techniques to recover the substrate modes, and nano-structured films to extract the ITO/organic modes and the SPP modes. However, most of these methods require complex techniques and expensive equipment, and the intensity of light can be enhanced only at special emission wavelengths in order to satisfy the Bragg condition. There is a need for OLEDs for which the enhancement of light intensity is not limited at particular emission wavelengths and which is easy to manufacture.

SUMMARY

Some embodiments disclosed herein provide a light-emitting device including a transparent substrate; a light-extracting polymer layer having one or more elevated regions distributed on a surface facing away from the transparent substrate; a first electrode layer, wherein the light-extracting polymer layer is disposed between the first electrode layer and the transparent substrate; a second electrode layer; and a light-emitting layer disposed between the first electrode layer and the second electrode layer, wherein the light-emitting layer is configured to emit light when a voltage is applied between the first electrode layer and the second electrode layer.

Some embodiments disclosed herein provide a method of making a light-emitting device, the method including applying a solution to a transparent substrate, wherein the solution comprises a first thermoplastic polymer, a second thermoplastic polymer, and an organic solvent; removing at least a portion of the organic solvent from the solution that is applied to the transparent substrate to solidify the first thermoplastic polymer and the second thermoplastic polymer to form a light-extracting polymer layer, wherein the light-extracting polymer layer includes one or more elevated regions distributed on a surface of the light-extracting polymer layer facing away from the transparent substrate; forming a first electrode layer on the surface of the light-extracting polymer layer having the one or more elevated regions; forming a light-emitting layer on the first electrode; and forming a second electrode on the light-emitting layer.

Some embodiments disclosed herein provide a method of making a light-emitting device, the method including providing a light extracting polymer layer on a substrate; forming one or more elevated regions on a surface of the light-extracting polymer layer facing away from the transparent substrate; forming a first electrode layer on the surface of the light-extracting polymer layer having the one or more elevated regions; forming a light-emitting layer on the first electrode; and forming a second electrode on the light-emitting layer.

Some embodiments disclosed herein provide a method of emitting light, the method including providing a light-emitting device, the light-emitting device having a transparent substrate; a light-extracting polymer layer having one or more elevated regions distributed on a surface of the light-extracting polymer layer facing away from the transparent substrate; a first electrode layer, wherein the light-extracting polymer layer is disposed between the first electrode layer and the transparent substrate; a second electrode layer; and a light-emitting layer disposed between the first electrode layer and the second electrode layer, wherein the light-emitting layer is configured to emit light when a voltage is applied between the first electrode layer and the second electrode layer. The method of producing light also includes applying a voltage between the first electrode layer and the second electrode layer to emit light from the light-emitting layer; and transmitting the light emitted from the light-emitting layer through the light-extracting polymer layer.

Some embodiments disclosed herein provide an article of manufacture having a light-emitting device, the light-emitting device including a transparent substrate; a light-extracting polymer having one or more elevated regions distributed on a surface of the light-extracting polymer layer facing away from the transparent substrate; a first electrode layer, wherein the light-extracting layer is disposed between the first electrode layer and the transparent substrate; a second electrode layer; and a light-emitting layer disposed between the first electrode layer and the second electrode layer, wherein the light-emitting layer is configured to emit light when a voltage is applied between the first electrode layer and the second electrode layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings.

FIG. 2(a) shows an AFM image of a surface of an indium tin oxide (ITO) film. FIG. 2(b) shows an AFM image of a surface of a polymethyl methacrylate (PMMA) film. FIG. 2(c) shows an AFM image of a surface of a polystyrene (PS) film. FIG. 2(d) shows an AFM image of a surface of a PMMA-PS blend film. In all four figures, the x-axis and y-axis are in micrometers, and the z-axis is marked at 15 nm and 60 nm.

FIGS. 3(a) to 3(d) illustrate non-limiting examples of various schematic structures of OLEDs. FIG. 3(a) illustrates an OLED device having an ITO electrode but without a polymer layer between the ITO electrode and the glass substrate (herein referred to as "ITO device"). FIG. 3(b) illustrates an OLED device having a silver electrode but without a polymer layer between the silver electrode and the glass substrate (herein referred to as "glass device"). FIG. 3(c) illustrates an OLED device having a silver electrode and a planar PMMA layer between the silver electrode and the glass substrate (herein referred to as "planar device"). FIG. 3(d) illustrates an OLED structure having a silver electrode and a corrugated PMMA/PS layer between the silver electrode and the glass substrate (herein referred to as "corrugated device"). In addition, FIG. 3(e) illustrates an example scanning electron microscope image of an organic layer and an aluminum layer of the OLED structure of FIG. 3(d). The scale in the bottom-right corner shows 0.5 microns.

In FIG. 4(a), the x-axis is voltage (V), and the y-axis is current density (mA/cm$^2$). In FIG. 4(b), the x-axis is current density (mA/cm$^2$), and the y-axis is luminance (cd/m$^2$). In FIG. 4(c), the x-axis is current density (mA/cm$^2$), and the y-axis is current efficiency (cd/A). In FIG. 4(d), the x-axis is current density (mA/cm$^2$), and the y-axis is EQE (%).

FIG. 6(a) shows a 2D AFM image of a PMMA-PS film, and an inset image which is a Fast Fourier Transform (FFT) pattern of the film. FIG. 6(b) shows a power spectra from the FTT as a function of grating period (the curved line in the plot) and the relation between the Bragg grating period and the wavelength of the outcoupling light from a normal direction. FIG. 6(c) shows a photo of a planar microcavity OLED (left, device of FIG. 3 (b)) and a corrugated microcavity OLED (right, device of FIG. 3 (d)) at 6 mA. FIG. 6(d) shows the intensity enhancement ratio of the PMMA-PS device as compared to the glass based device. In FIG. 6(b), the x-axis is wavelength (nm), and the y-axis is grating period (nm). In FIG. 6(d), the x-axis is wavelength (nm), and the y-axis is enhancement ratio.

FIG. 7(a) shows the result without the corrugated structures and FIG. 7(b) shows the result with the corrugated structures. FIG. 7 (c) shows a Lambertian emission pattern from the corrugated PMMA-PS device. In FIGS. 7(a) and 7(b), the x-axis is wavelength (nm), and the y-axis is electroluminescence intensity (a.u).

DETAILED DESCRIPTION

Figure 1A:
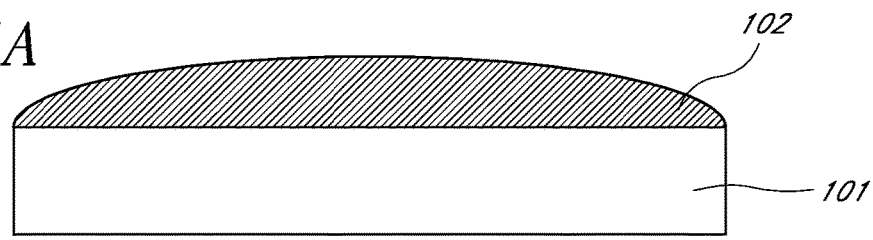
FIG. 1 illustrates a non-limiting example of a spin-coating process to prepare a film having elevated regions on a surface using a polymethyl methacrylate (PMMA)/polystyrene (PS) blend solution.
Figure 1A:
Figure 1A:
Figure 1B:
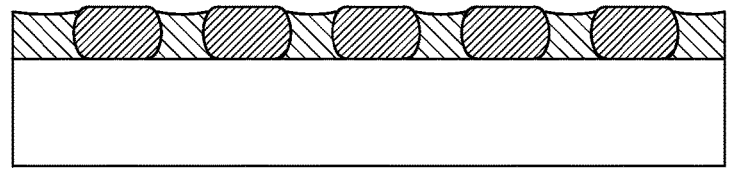
Figure 1B:
Figure 1C:
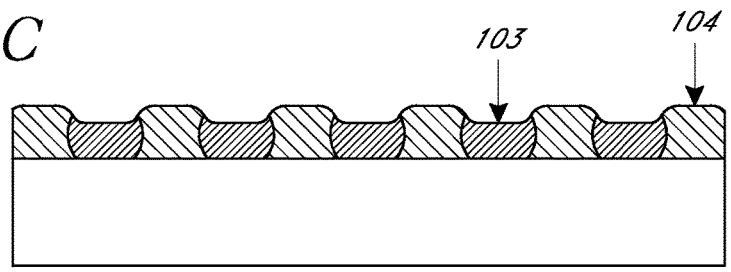

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Definitions

Unless defined otherwise, all technical and scientific terms used herein have the same meaning as is commonly understood by one of ordinary skill in the art. In the event that there is a plurality of definitions for a term, those in this section prevail unless stated otherwise.

The terms "light-extracting polymer layer" as used herein, refer to a polymer layer capable of emitting a substantial or major part of the light injected by a light source through waveguide mode or plasmon polariton (SPP) mode. The light-extracting polymer can be transparent, semi-transparent or opaque. In some embodiments, the light-extracting polymer layer can be transparent relative to light in the visible spectrum. In some embodiments, the light-extracting polymer layer can be semi-transparent relative to light in the visible spectrum. In some embodiments, the light-extracting polymer layer can be opaque relative to light in the visible spectrum.

The term "thermoplastic polymer" as used herein refers to thermoplastically processable polymer that turns to a liquid or becomes more liquid or less viscous when heated, and that can take on new shapes by the application of heat and pressure. Examples of suitable thermoplastic polymers include, but are not limited to, polymers such as polycarbonate, an acrylic, a polyolefin, a polystyrene, polyester resins (for example, polybutylene terephthalate (PBT), polyethylene terephthalate (PET), polyethylene isophthalate (PEI), polybutylene terephthalate/tetramethylene glycol copolymer, PET/PEI copolymer, polyacrylate (PAR), polybutylenenaphthalate (PBN), a polyester, (polyoxyalkylene diimidodiacid/polybutylene terephthalate copolymer, and other aromatic polyesters), polynitrile resins (for example, polyacrylonitrile (PAN), polymethacrylonitrile, acrylonitrile/styrene copolymer (AS), methacrylonitrile/styrene copolymer, methacrylonitrile/styrene/butadiene copolymer), poly(methyl)acrylate resins (for example, polymethyl methacrylate (PMMA), polyethyl methacrylate), polyvinyl resins (for example, vinyl acetate, polyvinyl alcohol (PVA), vinyl alcohol/ethylene copolymer (ENOH), polyvinylidene chloride (PNDC), polyvinyl chloride (PNC), vinyl chloride/vinylidene chloride copolymer, vinylidene chloride/methylacrylate copolymer), cellulose resins (for example, cellulose acetate and cellulose acetate butyrate), fluoro resins (for example, polyvinylidene fluoride (PNDF), polyvinyl fluoride (PNF), polychlorofluoroethylene (PCTFE), tetrafluoroethylene/ethylene copolymer (ETFE)), imide resins (for example, aromatic polyimide (PI)), or a copolymer thereof.

The term "hole-transport layer" as used herein refers to a film that has predominantly transport positive charges (holes). Examples of suitable materials for the hole-transport layer include but are not limited to N,N'-diphenyl-N,N'-bis (3-methylphenyl)-1,1'-diphenyl-4,4'-diamine (TPD), N-phenylcarbazole, and 4,4'-bis[N-(1-naphthyl)-N-phenylamino] biphenyl (NPB).

The term "hole-injection layer" as used herein refers to electrically conductive or semiconductive materials. The hole injection layer may have one or more functions in an LED device, including but not limited to, planarization of the underlying layer, charge transport and/or charge injection properties, scavenging of impurities such as oxygen or metal ions, and other aspects to facilitate or to improve the performance of the organic LED device. A suitable material for the hole-injection layer includes but is not limited to molybdenum trioxide ($MoO_3$).

The term "a normal direction" as used herein refers to a perpendicular or orthogonal direction. For example, an object such as a line or vector is normal to another object if they are perpendicular to each other. For example, in a two-dimensional case, a normal line to a curve at a given point is the line perpendicular to a tangent line to the curve at the point. In a three-dimensional case, a surface that is normal or substantially normal to a surface at a point P is a vector that is perpendicular to a tangent plane to that surface at P. The word "normal" can also be used to generalize orthogonality, such as a line normal to a plane, the normal component of a force, the normal vector, and the like. The concept of "normal direction" may also be generalized to differentiable manifolds of arbitrary dimensions embedded in an Euclidean space. The normal vector space or normal space of a manifold at a point P is a set of the vectors which are orthogonal to a tangent space at P.

Light Emitting Device

Structures having one or more elevated regions between a transparent substrate and an electrode can be used to enhance light emission of a LED. The electrode can be a metal anode and may be transparent, semi-transparent or opaque. A strong optical microcavity can be activated with two highly reflective electrodes. Although this microcavity can enhance the intensity of light, the electroluminescence spectrum may be narrowed and the emission pattern may show dependence on the viewing angle. By forming a polymer layer such as a film having one or more elevated regions in the light-emitting device, for example, between the anode and the transparent substrate, the problems of narrow electroluminescence spectrum and the dependence on the viewing angle can be overcome.

As disclosed herein, a light-emitting device can include a transparent substrate; a light-extracting polymer layer having one or more elevated regions distributed on a surface of the light-extracting polymer layer facing away from the transparent substrate; a first electrode layer, where the light-extracting polymer layer is disposed between the first electrode layer and the transparent substrate; a second electrode layer; and a light-emitting layer disposed between the first electrode layer and the second electrode layer, where the light-emitting layer is configured to emit light when a voltage is applied between the first electrode layer and the second electrode layer.

The light-extracting polymer layer can be formed of two or more polymers. For example, the light-extracting polymer layer can include a first thermoplastic polymer and a second thermoplastic polymer. The first thermoplastic polymer and the second thermoplastic polymer can be the same or different. Examples of the polymers for forming the light-extracting polymer layer include, but are not limited to, a blend solution of polystyrene and polymethyl methacrylate.

Figure 8:
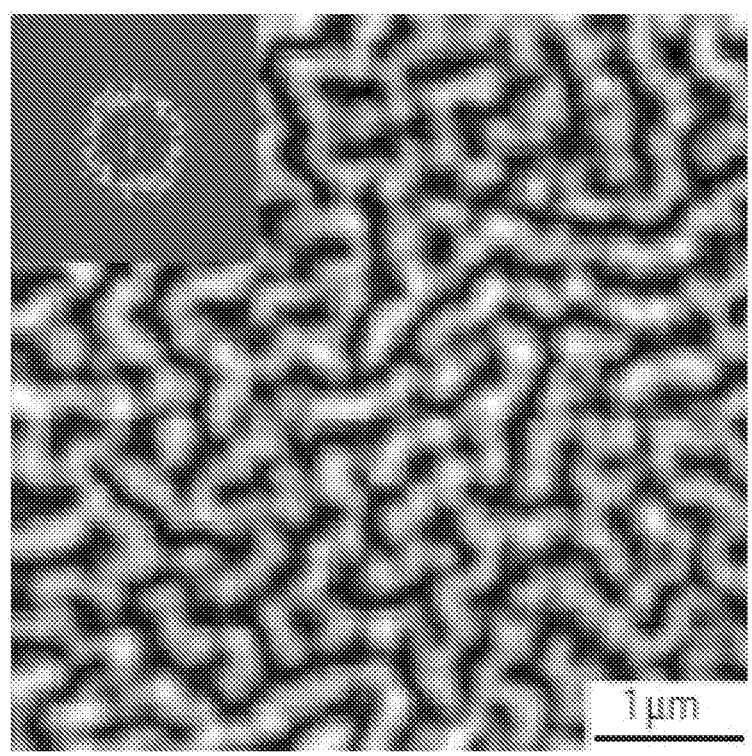
FIG. 8 shows a non-limiting example of an image of worm-like surface structure. The scale in the bottom-right corner shows 0.5 microns.

The light-extracting polymer layer can have one or more elevated regions which can be periodic structures, quasi-periodic structures, or random structures. The one or more elevated regions can be nanostructures or microstructures. Where the one or more elevated regions are periodic structures, the elevated regions may be uniform in size and may be uniformly distributed over a surface of the light-extracting polymer layer. Where the one or more elevated regions are random structures, the elevated regions may be non-uniform in size and may be randomly distributed over a surface of the light-extracting polymer layer. Where the one or more elevated regions are quasi-periodic structures, the elevated regions may have one portion that is periodic and another portion that is random. Examples of quasi-periodic structures include but are not limited to a corrugated structure and a worm-like structure. As a further example, FIG. 8 shows an image of a surface with a worm-like structure. The scale of the image is shown on the bottom right corner as 1 μm.

In some embodiments, the light-extracting polymer layer may include a thermoplastic polymer. The light-extracting polymer layer may encompass a variety of polymers. In some embodiments, the light-extracting polymer layer may include polycarbonate, an acrylic, a polyolefin, a polyester, polystyrene, or a copolymer thereof. The light-extracting polymer layer may also include other polymers such as those described herein for a first thermoplastic polymer and a second thermoplastic polymer. In some embodiments, the light-extracting polymer layer may include at least a first thermoplastic polymer and a second thermoplastic polymer.

The first thermoplastic polymer can encompass a variety of polymers. In some embodiments, the first thermoplastic polymer can be a polycarbonate, an acrylic, a polyolefin, a polyester, a polystyrene, or a copolymer thereof. In some embodiments, the first thermoplastic polymer can be polybutylene terephthalate (PBT), polyethylene terephthalate (PET), polyethylene isophthalate (PEI), polybutylene terephthalate/tetramethylene glycol copolymer, PET/PEI copolymer, polyacrylate (PAR), polybutylenenaphthalate (PBN), or a combination thereof. In some embodiments, the first thermoplastic polymer can be a polyester including polyoxyalkylene diimidodiacid/polybutylene terephthalate copolymer, and other aromatic polyesters. In some embodiments, the first thermoplastic polymer can be polynitrile resins including polyacrylonitrile (PAN), polymethacrylonitrile, acrylonitrile/styrene copolymer (AS), methacrylonitrile/styrene copolymer, methacrylonitrile/styrene/butadiene copolymer, or a combination thereof. In some embodiments, the first thermoplastic polymer can be poly(methyl)acrylate resins including polymethyl methacrylate (PMMA), polyethyl methacrylate, or a combination thereof. In some embodiments, the first thermoplastic polymer can be polyvinyl resins including vinyl acetate, polyvinyl alcohol (PVA), vinyl alcohol/ethylene copolymer (ENOH), polyvinylidene chloride (PNDC), polyvinyl chloride (PNC), vinyl chloride/vinylidene chloride copolymer, vinylidene chloride/methylacrylate copolymer, or a combination thereof. In some embodiments, the first thermoplastic polymer can be cellulose resins including cellulose acetate, cellulose acetate butyrate or a combination thereof. In some embodiments, the first thermoplastic polymer can be fluoro resins including polyvinylidene fluoride (PNDF), polyvinyl fluoride (PNF), polychlorofluoroethylene (PCTFE), tetrafluoroethylene/ethylene copolymer (ETFE), or a combination thereof. In some embodiments, the first thermoplastic polymer is polymethyl methacrylate (PMMA). In some embodiments, the first thermoplastic polymer is an imide resin.

More specifically, the first thermoplastic polymer can be branched or linear. The molecular weight of the first thermoplastic polymer can vary, for example about 20,000 to about 400,000. For example, the average molecular weight of the first thermoplastic polymer can be about 25,000 to about 350,000, or about 25,000 to about 250,000, or about 25,000 to about 150,000, or about 25,000 to about 100,000, or about 25,000 to about 75,000, or about 25,000 to about 50,000. Specific examples of the molecular weight of the first thermoplastic polymer include about 20,000, about 25,000, about 50,000, about 75,000, about 100,000, about 150,000, about 200,000, about 300,000, about 400,000, or ranges between any two of these values (including endpoints). In some embodiments, the first thermoplastic polymer is PMMA. The average molecular weight of PMMA can vary, for example, about 20,000 to about 400,000, about 25,000 to about 350,000, about 100,000 to about 300,000, or about 50,000 to about 325,000. In some embodiments, the first thermoplastic polymer is PMMA with an average molecular weight of about 350,000. In some embodiments, the first thermoplastic polymer is PMMA with an average molecular weight of about 25,000. In some embodiments, the first thermoplastic polymer can be PMMA with an average molecular weight of about 25,000 to about 350,000.

The first thermoplastic polymer can include a monomer unit represented by Formula I:

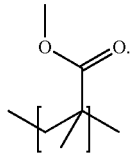

In some embodiments, the monomer unit can be optionally substituted.

The second thermoplastic polymer can also encompass a variety of polymers. In some embodiments, the second thermoplastic polymer is different from the first thermoplastic polymer. In some embodiments, the second thermoplastic polymer is a polycarbonate, an acrylic, a polyolefin, a polyester, a polystyrene, or a copolymer thereof, and in further embodiments, the first thermoplastic polymer and the second thermoplastic polymer are different from each other. In some embodiments, the second thermoplastic polymer is polystyrene (PS).

The second thermoplastic polymer can be branched or linear. The average molecular weight of the second thermoplastic polymer can vary, for example about 20,000 to about 300,000. For example, the average molecular weight of the second thermoplastic polymer can be about 20,000 to about 300,000, or about 50,000 to about 250,000, or about 50,000 to about 200,000, or about 80,000 to about 180,000, or about 100,000 to about 150,000. Specific examples of the average molecular weight of the second thermoplastic polymer include about 20,000, about 25,000, about 50,000, about 75,000, about 100,000, about 150,000, about 200,000, about 250,000, about 300,000, or ranges between any two of these values (including endpoints). In some embodiments, the second thermoplastic polymer can be PS with an average molecular weight of about 50,000 to about 250,000. In some embodiments, the second thermoplastic polymer can be PS with an average molecular weight of about 25,000 to about 300,000. In some embodiments, the second thermoplastic polymer can be PS with an average molecular weight of about 50,000 to about 200,000. In some embodiments, the second thermoplastic polymer can be PS with an average molecular weight of about 100,000 to about 200,000. In some embodiments, the second thermoplastic polymer can be PS with an average molecular weight of about 50,000. In some embodiments, the second thermoplastic polymer can be PS with an average molecular weight of about 100,000. In some embodiments, the second thermoplastic polymer can be PS with an average molecular weight of about 150,000. In some embodiments, the second thermoplastic polymer can be PS with an average molecular weight of about 250,000.

In some embodiments, the second thermoplastic polymer includes a monomer unit represented by Formula II:

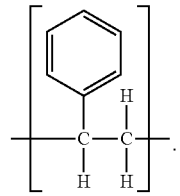

In some embodiments, the monomer unit can be optionally substituted.

The first thermoplastic polymer and the second thermoplastic polymer can be different polymers. In some embodiments, the first thermoplastic polymer can be polymethyl methacrylate, or a copolymer thereof, and the second thermoplastic polymer can be polystyrene, or a copolymer thereof.

The first thermoplastic polymer and the second thermoplastic polymer can be present in the light-emitting device at a desirable ratio by weight. And the desirable ratio by weight can vary, for example, about 1:20 to about 20:1. For example, the ratio by weight of the first thermoplastic polymer to the second thermoplastic polymer in the device can be about 1:20 to about 20:1, about 1:15 to about 15:1, about 1:10 to about 10:1, or about 1:5 to about 5:1. In some embodiments, the ratio by weight of the first thermoplastic polymer to the second thermoplastic polymer can be about 1:10 to about 10:1. In some embodiments, the ratio by weight of the first thermoplastic polymer to the second thermoplastic polymer can be about 1:20 to about 20:1. In some embodiments, the ratio by weight of the first thermoplastic polymer to the second thermoplastic polymer can be about 1:5 to about 5:1. In some embodiments, the ratio by weight of the first thermoplastic polymer to the second thermoplastic polymer can be about 1:20 to about 10:1. In some embodiments, the ratio by weight of the first thermoplastic polymer to the second thermoplastic polymer can be about 1:10 to about 20:1. In some embodiments, the ratio by weight of the first thermoplastic polymer to the second thermoplastic polymer can be no less than about 1:10. In some embodiments, the ratio by weight of the first thermoplastic polymer to the second thermoplastic polymer can be smaller than about 20:1. Specific examples of the ratio include about 1:20, about 1:15, about 1:10, about 1:5, about 1:1, about 5:1, about 10:1, about 15:1, about 20:1, and ranges between any two of these values (including endpoints).

The average thickness of the light-extracting polymer layer can vary, for example, from about 5 nm to about 500 nm. For example, the average thickness can be about 5 nm, about 50 nm, about 100 nm, about 150 nm, about 200 nm, about 250 nm, about 300 nm, about 350 nm, about 400 nm, about 450 nm, about 500 nm, or a thickness between any of these values. In some embodiments, the light-extracting polymer layer can have an average thickness of less than about 500 nm. In some embodiments, the light-extracting polymer layer can have an average thickness of less than about 250 nm. In some embodiments, the light-extracting polymer layer can have an average thickness of less than about 200 nm. In some embodiments, the light-extracting polymer layer can have an average thickness of less than about 100 nm. In some embodiments, the light-extracting polymer layer can have an average thickness of less than about 50 nm.

The light-extracting polymer layer can have one or more elevated regions. The one or more elevated regions can be periodic, non-periodic or quasi periodic structures. The elevated regions can be present in structures such as corrugated structures or worm-like structures. The elevated regions can also be nano-sized or micro-sized. In some embodiments, the light-extracting polymer layer may form a corrugated surface. In some embodiments, the light-extracting polymer layer may include a plurality of elevated regions arranged adjacent to a plurality of lowered regions in a corrugated structure.

The adjacent elevated regions in the light-extracting polymer layer can have a suitable spacing length. In some embodiments, the average spacing between adjacent elevated regions in the light-extracting polymer layer can be about 0.001 μm to about 10 μm. In some embodiments, the average spacing between adjacent elevated regions in the light-extracting polymer layer is 10 μm, about 5 μm, about 1 μm, about 0.5 μm, about 0.1 μm, about 0.05 μm, about 0.01 μm, about 0.005 μm, about 0.001 μm, or a spacing length between any of these values. In some embodiments, the average spacing between adjacent elevated regions in the light-extracting polymer layer can be less than about 10 μm. In some embodiments, the average spacing between adjacent elevated regions in the light-extracting polymer layer can be less than about 1 μm. In some embodiments, the average spacing between adjacent elevated regions in the light-extracting polymer layer can be less than about 0.1 μm. In some embodiments, the average spacing between adjacent elevated regions in the light-extracting polymer layer can be less than about 0.01 μm. In some embodiments, the average spacing between adjacent elevated regions in the light-extracting polymer layer can be less than about 0.001 μm.

The number of elevated regions in the light-extracting polymer layer can be controlled to be within a desirable range. In some embodiments, the light-extracting polymer layer can have at least about $10^7$ elevated regions per $cm^2$. In some embodiments, the light-extracting polymer layer can have at least about $10^8$ elevated regions per $cm^2$. In some embodiments, the light-extracting polymer layer can have at least about $10^9$ elevated regions per $cm^2$. In some embodiments, the light-extracting polymer layer can have at least about $10^{10}$ elevated regions per $cm^2$. In some embodiments, the light-extracting polymer layer can have about $10^7$ elevated regions per $cm^2$ to about $10^{12}$ elevated regions per $cm^2$. For example, the light-extracting polymer layer can have about $10^7$ elevated regions per $cm^2$, about $5 \times 10^7$ elevated regions per $cm^2$, about $10^8$ elevated regions per $cm^2$, about $5 \times 10^8$ elevated regions per $cm^2$, about $10^9$ elevated regions per $cm^2$, about $5 \times 10^9$ elevated regions per $cm^2$, about $10^{10}$ elevated regions per $cm^2$, about $5 \times 10^{10}$ elevated regions per $cm^2$, about $10^{11}$ elevated regions per $cm^2$, about $5 \times 10^{11}$ elevated regions per $cm^2$, about $10^{12}$ elevated regions per $cm^2$, or a value between any of these values. In some embodiments, the light-extracting polymer layer can have no less than about $10^9$ and no more than $10^{11}$ elevated regions per $cm^2$. In some embodiments, the light-extracting polymer layer can have no less than about $10^8$ and no more than $10^{11}$ elevated regions per $cm^2$. In some embodiments, the light-extracting polymer layer can have no less than about $10^9$ and no more than $10^{12}$ elevated regions per $cm^2$.

The height of the elevated regions in the light-extracting polymer layer can vary. In some embodiments, the height of each of the elevated regions in the light-extracting polymer layer is about 5 nm to about 30 nm. For example, each of the elevated regions can have a height of about 5 nm, about 10 nm, about 15 nm, about 20 nm, about 25 nm, about 30 nm, or a height between any of these values. In some embodiments, the average height of the elevated regions in the light-extracting layer is about 5 nm to about 30 nm. For example, the average height can be about 5 nm, about 10 nm, about 15 nm, about 20 nm, about 25 nm, about 30 nm, or an average height between any of these values. In some embodiments, each of elevated regions in the light-extracting polymer layer has a height of at least about 15 nm. In some embodiments, each of elevated regions in the light-extracting polymer layer has a height of at least about 25 nm. In some embodiments, each of elevated regions in the light-extracting polymer layer has a height of between about 10 nm and about 20 nm. In some embodiments, the average height of the elevated regions in the light-extracting polymer layer is least about 15 nm. In some embodiments, the average height of the elevated regions in the light-extracting polymer layer is least about 25 nm. In some embodiments, the average height of the elevated regions in the light-extracting polymer layer is about 5 nm to about 30 nm.

The transparent substrate can be made of a variety of materials. In some embodiments, the substrate can be a ceramic. In some embodiments, the substrate can be glass. In some embodiments, the substrate can be plastic.

The substrate can have a water contact angle. In some embodiments, the substrate can have a water contact angle of less than about 100°. In some embodiments, the substrate can have a water contact angle of less than about 80°. In some embodiments, the substrate can have a water contact angle of less than about 60°. For example, the water contact angle can be about 100°, about 90°, about 80°, about 70°, about 60°, or a contact angle between any two of these values (including endpoints).

The first electrode can be an anode and can include various types of materials. In some embodiments, the first electrode includes silver, gold, indium tin oxide, or combinations thereof.

The second electrode can be a cathode and can include a variety of metal materials. In some embodiments, the second electrode includes silver, aluminum, lithium oxide, magnesium, and alloy of magnesium and silver, or combinations thereof.

The electrode can be transparent, semi-transparent, or opaque relative to light in the visible spectrum. In some embodiments, the electrode can be transparent. In some embodiments, the electrode can be semi-transparent. In some embodiments, the electrode can be opaque.

The light-emitting device disclosed herein can include a hole-transport layer disposed between the first electrode and the light-emitting layer. In some embodiments, the hole-transport layer can include N,N'-diphenyl-N,N'-bis(1-naphthyl)-(1,1'-biphenyl)-4,4'-diamine Any suitable materials known to be used for making the hole-transport layer can also be used here. Examples include but not limited to N,N'-bis(naphthalen-1-yl)-N,N'-bis(phenyl)-benzidine (NPB), N,N'-bis(naphthalen-2-yl)-N,N'-bis(phenyl)-benzidine (β-NPB), N,N'-bis(3-methylphenyl)-N,N'-bis(phenyl)-benzidine (TPD), and Di-[4-(N,N-ditolyl-amino)-phenyl] cyclohexane (TACP).

The lighting device disclosed herein can include a hole-injection layer disposed between the first electrode and the light-emitting layer. In some embodiments, the hole-injection layer can include molybdenum trioxide. Any suitable materials known for being used for making the hole-injection layer can also be used here. Examples include but not limited to phthalocyanine and copper complex such as CuPC.

The lighting device disclosed herein can include an electron-injection layer disposed between the second electrode and the light-emitting layer. In some embodiments, the electron-injection layer includes lithium fluoride.

In some embodiments, the lighting device includes an electron-transport layer disposed between the second electrode and the light-emitting layer.

The light-emitting layer can include a variety of materials. In some embodiments, the light-emitting layer includes an organic electroluminescent material, for example, tris(8-hydroxyquinolinato)aluminum and a phosphorescent or fluorescent material. In some embodiments, the organic electroluminescent material is tris(8-hydroxyquinolinato) aluminum. In some embodiments, the light-emitting layer includes a phosphorescent, a fluorescent material, or both. Examples of suitable materials for forming the light-emitting layer include, but are not limited to Tris(8-hydroxyquinolinato)aluminum (Alq3), 9,10-di(naphth-2-yl)anthracene (ADN), 2-tert-butyl-9,10-di(naphth-2-yl)anthracene (TBADN), 2-methyl-9,10-bis(naphthalen-2-yl)anthracene (MADN), 1,3,5-tri(pyren-1-yl)benzene (TPB3), 2,2'-bi(9,10-diphenyl-anthracene) (TPBA), 1,3-bis(carbazol-9-yl) benzene (MCP), 1,3,5-tris(carbazol-9-yl)benzene (TCP), 4,4',4''-tris(carbazol-9-yl)triphenylamine (TcTb), 4,4'-bis (carbazol-9-yl)biphenyl (CBP), 4,4,8,8-12,12-hexa-p-tolyl-4H-8H-12H-12C-Aza-dibenzo[cd,mn]pyrene (FATPA), Green Dopant Materials such as 2,3,6,7-tetrahydro-1,1,7,7-tetramethyl-1H, 5H,11H-10-(2-benzothiazolyl)quinolizino [9,9a,1gh]coumarin (C545 T), Tris(2-phenylpyridine) iridium(III) (Ir(ppy)3), 9,10-bis[phenyl(m-tolyl)-amino] anthracene (TPA), Blue Dopant Materials such as 4,4'-bis (9-ethyl-3-carbazovinylene)-1,1'-biphenyl (BCzVBi), 4,4'-bis[4-(di-p-tolylamino)styryl]biphenyl (DPAVBi), Bis(3,5-difluoro-2-(2-pyridyl)phenyl-(2-carboxypyridyl)iridium(III) (FIrPic), Red Dopant Materials such as (E)-2-(2-(4-(dimethylamino)styryl)-6-methyl-4H-pyran-4-ylidene)malononitrile (DCM), 4-(dicyanomethylene)-2-methyl-6-julolidyl-9-enyl-4H-pyran (DCM2), 4-(dicyanomethylene)-2-tert-butyl-6-(1,1,7,7-tetramethyljulolidin-4-yl-vinyl)-4H-pyran (DCJTB), and 5,6,11,12-tetraphenylnaphthacene (Rubrene), The light-extracting polymer layer disclosed herein can improve a current efficiency of the light-emitting device. In some embodiments, the light-extracting layer is configured to improve a current efficiency of the light emitting device by at least about 15% relative to the same light-emitting device lacking the light extracting polymer layer. In other embodiments, the light-extracting layer is configured to improve a current efficiency of the light-emitting device by at least about 25%. In some embodiments, the light-extracting layer is configured to improve a current efficiency of the light emitting device by at least about 35%.

The maximum luminance of the light emitting device disclosed herein can vary. In some embodiments, the light-emitting device can have a maximum luminance of at least about 20,000 $cd/m^2$. In some embodiments, the light-emitting device can have a maximum luminance of at least about 22,000 $cd/m^2$. In some embodiments, the light-emitting device can have a maximum luminance of at least about 25,000 $cd/m^2$.

The one or more elevated regions as disclosed herein may not be restricted to the light-extracting polymer layer and may be present in one or more layers provided on the light-extracting polymer layer. The one or more layers may include the first electrode layer, the second electrode layer, the light-emitting layer, the hole-transport layer, the hole-injection layer, the electron injection layer, or any combination thereof. The formation of the one or more elevated regions in the one or more layers may, for example, be a result of the layers conforming to the terrain of the light-extracting polymer layer beneath the layers. The one or more elevated regions may also be formed by other means such as nano-lithography, electron-beam lithography, photo etching, abrasive blasting, or a combination thereof.

Thus in some embodiments, the electrode layer can have one or more elevated regions. In some embodiments, the light-emitting layer can have one or more elevated regions. The one or more elevated regions may be as described above for the light extracting polymer layer.

Method of Making a Light-Emitting Device

Methods of making a light-emitting device are disclosed herein. The method can include applying a solution to a transparent substrate, wherein the solution includes a first thermoplastic polymer, a second thermoplastic polymer, and an organic solvent; removing at least a portion of the organic solvent from the solution that is applied to the substrate to solidify the first thermoplastic polymer and the second thermoplastic polymer to form a light-extracting polymer layer, wherein the light-extracting polymer layer includes one or more elevated regions distributed on a surface of the light-extracting polymer layer facing away from the transparent substrate; forming a first electrode layer on the surface of the light-extracting polymer layer having the one or more elevated regions; forming a light-emitting layer on the first electrode; and forming a second electrode on the light-emitting layer.

Applying the solution to the substrate can include spin coating the solution on the substrate. The spin coating speed can be adjusted to achieve a desirable coating result. In some embodiments, the spin coating can be performed at a speed of about 500 rpm to about 6,000 rpm. For example, the spin coating can be performed at a speed of about 500 rpm, about 1000 rpm, about 2000 rpm, about 3000 rpm, about 4000 rpm, about 5000 rpm, about 6000 rpm, or a speed between any of these values. In some embodiments, the spin coating can be performed at a speed of from about 1000 rpm to about 5000 rpm, from about 1000 rpm to about 4000 rpm, and from about 2000 rpm to about 3000 rpm. In some embodiments, the spin coating can be performed at a speed of no less than 1000 rpm. The spin coating duration can also be adjusted to achieve a desirable coating result. The spin coating can be performed for various periods of time, such as from about 15 seconds to about 60 seconds. For example, the spin coating can be performed for about 15 seconds, about 20 seconds, about 30 seconds, about 40 seconds, about 50 seconds, or about 60 seconds.

Removing at least the portion of the organic solvent from the solution applied to the substrate can include heating the solution applied to the substrate at an elevated temperature. In some embodiments, the elevated temperature for removing the solvent can be of at least about 40° C. In some embodiments, the elevated temperature for removing the solvent can be of at least about 50° C. In some embodiments, the elevated temperature for removing the solvent can be of at least about 60° C. In some embodiments, the elevated temperature for removing the solvent can be of at least about 80° C. In some embodiments, the elevated temperature for removing the solvent can be of at least about 100° C. In some embodiments, the elevated temperature for removing the solvent can be in the range of about 70° C. to about 130° C. The elevated temperature for removing the solvent can be in the range of about 70° C. to about 130° C., 80° C. to about 120° C., and 90° C. to about 110° C. In some embodiments, the elevated temperature for removing the solvent can be in the range of about 80° C. to about 120° C. In some embodiments, the elevated temperature for removing the solvent can be in the range of about 90° C. to about 110° C. In some embodiments, the elevated temperature for removing the solvent can be of about 40° C., about 50° C., about 60° C., about 70° C., about 80° C., about 90° C., about 100° C., about 110° C., about 120° C., about 130° C., or a temperature between any of these values. Alternatively or in combination with heating, at least the portion of the organic solution can be removed using reduced pressure.

In some embodiments, removing the organic solvent can be achieved through vacuum drying.

As described herein, the first thermoplastic polymer can encompass a variety of polymers as described above. In some embodiments, the first thermoplastic polymer can be a polycarbonate, an acrylic, a polyolefin, a polyester, a polystyrene, or a copolymer thereof. In other embodiments, the first thermoplastic polymer can be polybutylene terephthalate (PBT), polyethylene terephthalate (PET), polyethylene isophthalate (PEI), polybutylene terephthalate/tetramethylene glycol copolymer, PET/PEI copolymer, polyacrylate (PAR), polybutylenenaphthalate (PBN), or copolymer thereof. In some embodiments, the first thermoplastic polymer can be a polyester including polyoxyalkylene diimidodiacid/polybutylene terephthalate copolymer, and other aromatic polyesters. In some embodiments, the first thermoplastic polymer can be polynitrile resins including polyacrylonitrile (PAN), polymethacrylonitrile, acrylonitrile/styrene copolymer (AS), methacrylonitrile/styrene copolymer, methacrylonitrile/styrene/butadiene copolymer, or a combination thereof. In some embodiments, the first thermoplastic polymer can be poly(methyl)acrylate resins including polymethyl methacrylate (PMMA), polyethyl methacrylate, or a combination thereof. In some embodiments, the first thermoplastic polymer can be polyvinyl resins including vinyl acetate, polyvinyl alcohol (PVA), vinyl alcohol/ethylene copolymer (ENOH), polyvinylidene chloride (PNDC), polyvinyl chloride (PNC), vinyl chloride/vinylidene chloride copolymer, vinylidene chloride/methylacrylate copolymer, or a combination thereof. In some embodiments, the first thermoplastic polymer can be cellulose resins including cellulose acetate, cellulose acetate butyrate, or a combination thereof. In some embodiments, the first thermoplastic polymer can be fluoro resins including polyvinylidene fluoride (PNDF), polyvinyl fluoride (PNF), polychlorofluoroethylene (PCTFE), tetrafluoroethylene/ethylene copolymer (ETFE), or a combination thereof. In some embodiments, the first thermoplastic polymer can be an imide resin.

The first thermoplastic polymer can include at least one monomer unit represented by Formula I:

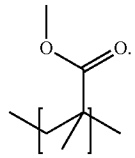

In some embodiments, the monomer unit can be optionally substituted.

As disclosed herein, the second thermoplastic polymer can also encompass a variety of polymers as described above. The second thermoplastic polymer can be different from the first thermoplastic polymer. In some embodiments, the second thermoplastic polymer is a polycarbonate, an acrylic, a polyolefin, a polyester, a polystyrene, or a copolymer thereof, and in further embodiments, the first thermoplastic polymer and the second thermoplastic polymer are different from each other.

In some embodiments, the second thermoplastic polymer includes at least one monomer unit represented by Formula II:

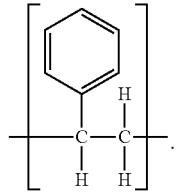

In some embodiments, the monomer unit can be optionally substituted.

The first thermoplastic polymer and the second thermoplastic polymer are different polymers. In some embodiments, the first thermoplastic polymer can be polymethyl methacrylate, or a copolymer thereof, and the second thermoplastic polymer can be polystyrene, or a copolymer thereof.

The first thermoplastic polymer and the second thermoplastic polymer can be present in the light-emitting device at a selected ratio by weight as described above. In some embodiments, the ratio by weight of the first thermoplastic polymer to the second thermoplastic polymer can be from about 1:10 to about 10:1. In some embodiments, the ratio by weight of the first thermoplastic polymer to the second thermoplastic polymer can be from about 1:20 to about 20:1. In some embodiments, the ratio by weight of the first thermoplastic polymer to the second thermoplastic polymer can be from about 1:5 to about 5:1. In some embodiments, the ratio by weight of the first thermoplastic polymer to the second thermoplastic polymer can be from about 1:20 to about 10:1. In some embodiments, the ratio by weight of the first thermoplastic polymer to the second thermoplastic polymer can be from about 1:10 to about 20:1. In some embodiments, the ratio by weight of the first thermoplastic polymer to the second thermoplastic polymer can be no less than about 1:10. In some embodiments, the ratio by weight of the first thermoplastic polymer to the second thermoplastic polymer can be smaller than about 20:1.

A variety of organic solvents can be used in making the light-emitting device. In some embodiments, the organic solvent is volatile. In some embodiments, the organic solvent has a boiling point of less than about 150° C. In some embodiments, the organic solvent has a boiling point of less than or equal to about 120° C. In some embodiments, the organic solvent has a boiling point of less than about 100° C. One or more solvents can be used.

The organic solvent may have different solubility for different polymers. In some embodiments, the organic solvent can be a non-polar solvent or a polar aprotic solvent. In some embodiments, the organic solvent can include one or more of toluene, methyl ethyl ketone, tetrahydrofuran, or chloroform. In some embodiments, the organic solvent is tetrahydrofuran. In some embodiments, the organic solvent is chloroform. In some embodiments, the organic solvent includes tetrahydrofuran and chloroform.

Forming the first electrode layer on the surface of the light-extracting polymer layer can include deposition, spin coating, inkjet printing, or laser induced thermal imaging. The first electrode can be formed of one or more of a variety of materials. In some embodiments, the first electrode includes silver, gold, indium tin oxide, or combinations thereof. In some embodiments, the first electrode includes silver. In some embodiments, the first electrode includes gold. In some embodiments, the first electrode includes indium tin oxide.

Forming the light-emitting layer on the surface of the light-extracting polymer layer can include deposition, spin coating, inkjet printing, or laser induced thermal imaging. The light-emitting layer can be formed of a variety of materials. In some embodiments, the light-emitting layer includes an organic electroluminescent material. In some embodiments, the organic electroluminescent material is tris(8-hydroxyquinolinato)aluminum.

Forming the second electrode layer on the surface of the light-extracting polymer layer can include deposition, spin coating, inkjet printing, laser induced thermal imaging, or a combination thereof. The second electrode can be formed of a variety of materials. In some embodiments, the second electrode includes silver, aluminum, lithium fluoride, lithium oxide, or a combination thereof.

An additional layer may be used to reduce a potential barrier between the cathode and the light-emitting layer. In some embodiments, the additional layer can be LiF.

An alternative method of making a light-emitting device is disclosed herein. The method can include providing a light extracting polymer layer on a substrate; forming one or more elevated regions on a surface of the light-extracting polymer layer facing away from the transparent substrate; forming a first electrode layer on the surface of the light-extracting layer having the one or more elevated regions; forming a light-emitting layer on the first electrode layer; and forming a second electrode layer on the light-emitting layer.

In some embodiments, the light-extracting polymer layer can be as described above. For example, the light-extracting polymer layer may include polycarbonate, an acrylic, a polyolefin, a polyester, polystyrene, or a copolymer thereof.

Any method that can create the one or more elevated regions in the light-extracting polymer layer may be used. In some embodiments, the forming of the one or more elevated regions may include nano-lithography, electron-beam lithography, photo etching, abrasive blasting, or a combination thereof.

The forming of the first electrode layer, the light-emitting layer, and the second electrode layer may be in accordance with the methods as described above. The forming of the one or more elevated regions in the first electrode layer, the light-emitting layer, and the second electrode layer may also be in accordance with the methods as described above.

Methods of emitting light are also disclosed herein. The method can include the step of providing a light-emitting device. The light device includes a substrate; a light-extracting polymer layer having one or more elevated regions distributed on a surface of the light-extracting layer facing away from the transparent substrate; a first electrode layer, wherein the light-extracting polymer layer is disposed between the first electrode layer and the transparent substrate; a second electrode layer; and a light-emitting layer disposed between the first electrode layer and the second electrode layer, wherein the light-emitting layer is configured to emit light when a voltage is applied between the first electrode layer and the second electrode layer. The method of producing light also includes the step of applying a voltage between the first electrode layer and the second electrode layer to emit light from the light-emitting layer; and transmitting the light emitted from the light-emitting layer through the light-extracting polymer layer.

Also disclosed herein are articles of manufacture having at least one light-emitting device. The article of manufacture can include the light-emitting device having a transparent substrate; a light-extracting polymer layer having one or more elevated regions distributed on a surface of the light-extracting polymer layer facing away from the transparent substrate; a first electrode layer, wherein the light-extracting polymer layer is disposed between the first electrode layer and the transparent substrate; a second electrode layer; and a light-emitting layer disposed between the first electrode layer and the second electrode layer, wherein the light-emitting layer is configured to emit light when a voltage is applied between the first electrode layer and the second electrode layer.

EXAMPLES

Additional embodiments are disclosed in further detail in the following examples, which are not in any way intended to limit the scope of the claims.

Example 1

Preparation of PS/PMMA Film

Polystyrene (PS) (MW=250,000, purchased from ACROS and Alfa Aesar China, Shanghai, China) was dissolved in tetrahydrofuran (THF) to form a polymer solution with a concentration of 20 mg/ml. Polymethyl Methacrylate (PMMA) (MW=350,000 purchased from ACROS and Alfa Aesar China, Shanghai, China) was dissolved in THF to form a polymer solution with a concentration of 20 mg/ml. The solutions of PS and PMMA were mixed in a predetermined proportion. The ratio of PMMA and PS was 7:3 by weight (about 2.3:1) and the concentration of the blended solution was 20 mg/ml. Before forming a corrugated structure on a glass substrate, the glass substrate was cleaned with deionized water, acetone, and ethanol, and dried under infrared light. The PMMA-PS blend solutions were spin-coated separately on the glass substrates at a speed of 3000 rpm for 30 seconds. The film was annealed at 70° C. in an oven for 30 minutes. After the substrates were cooled to room temperature (25° C.), a 20 nm thick Ag layer was deposited on the corrugated structure as a semi-transparent anode by thermal evaporation. To reduce interfacial dipole between the Ag anode and organic layers to be deposited thereon, $MoO_3$ (1 nm) was deposited on the Ag anode layer. The organic layers were deposited on the anode layer and include a 60 nm thick N,N'-diphenyl-N,N'-bis(1-napthyl-phenyl)-1.1'-biphenyl-4.4'-diamine (NPB) and a 60 nm thick tris-(8-hydroxyquinoline) aluminum (Alq3) as a hole-transporting layer (HTL) and a light emitting layer, respectively. Finally, LiF (1 nm)/Al (150 nm) was deposited on the organic layers to form a cathode. All of the layers were prepared by thermal evaporation at a pressure of less than $10^{-3}$ Pa. Luminance-current density-voltage (L-J-V) characteristics were measured using a Keithley 2602 source meter (Keithley Instruments, Inc., Cleveland, Ohio, USA) and a luminance meter (Keithley Instruments, Inc., Cleveland, Ohio, USA).

A PR650 spectrophotometer (Photo Research, Inc., Chatsworth, Calif., USA) was utilized to measure electroluminescent (EL) spectra. The active area of the resulting OLED device was 3 mm×4 mm, and all the measurements were performed under ambient conditions.

FIG. 1 shows an example of a spin-coating process used to prepare the corrugated structure with polymethyl methacrylate (PMMA)/polystyrene (PS) blend solution. First, the blend solution of PS/PMMA in THF was dropped on the pre-cleaned glass substrate 101 (FIG. 1a) to form a layer 102. As PS has a higher solubility in THF than PMMA, the differences in solubilities of PMMA and PS in THF resulted in a phase separation of the two polymers. During the spin-coating process, the PS-rich phase contained more THF than the PMMA-rich phase, and the PMMA-rich phase was depleted of the solvent at a faster rate than the PS-rich phase. The different solvent evaporation rates resulted in the PMMA-rich phase to be elevated to form elevated regions. As the THF continued to evaporate, the PS-rich phase 103 sank (FIG. 1(c)) to form lowered regions, while the PMMA-rich phase 104 rose to form the elevated regions.

Example 2

Surface Morphology Comparison of ITO, PS, PMMA and PMMA-PS Films

Figures 2A, 2B:
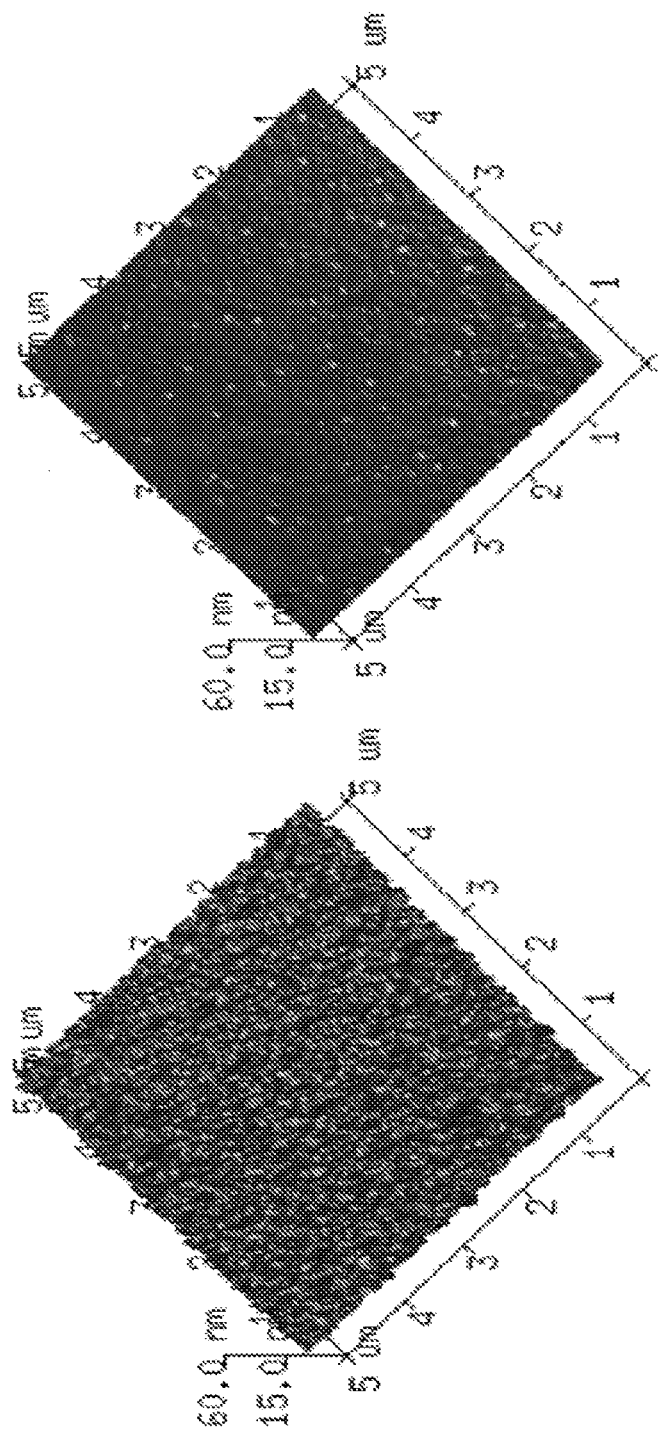
FIGS. 2(a) to 2(d) show atomic force microscopy (AFM) images of surfaces of different films.
Figures 2C, 2D:
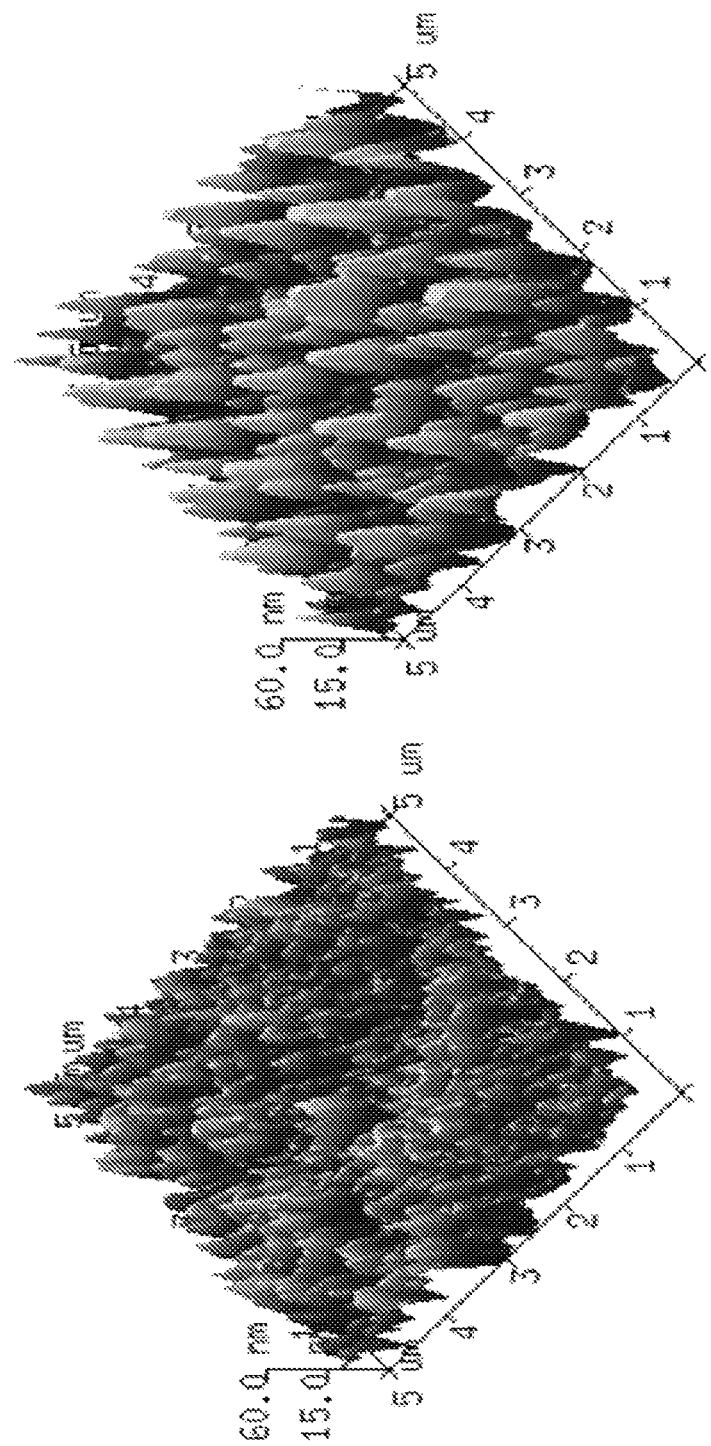

PS and PMMA films were prepared by the spin-coating process as described in Example 1 using solutions of PS in THF and PMMA in THF. FIG. 2 shows the surface morphologies of the ITO film, PMMA film, PS film and PMMA-PS blend film as measured by atomic force microscopy (AFM). The surfaces of ITO and PMMA were smooth. The PS film showed an amorphous rough surface while the PMMA/PS film showed 2D nanostructures with elevated regions and depths of 50-70 nm. The root-mean-square (RMS) roughness values of the ITO, PMMA, PS and PMMA-PS films were 2.4, 0.459, 15.7 and 23.4 nm, respectively. As shown in FIG. 2(b) and FIG. 2(c), the PMMA can adsorb on the polar glass surface better than the PS, and the PMMA film had a smoother surface morphology than the PS film. The elevated region in FIG. 2(d) is the PMMA-rich phase while the lowered region is the PS-rich phase.

Example 3

OLED Structures with Different Anode Materials

Figures 3D, 3E:
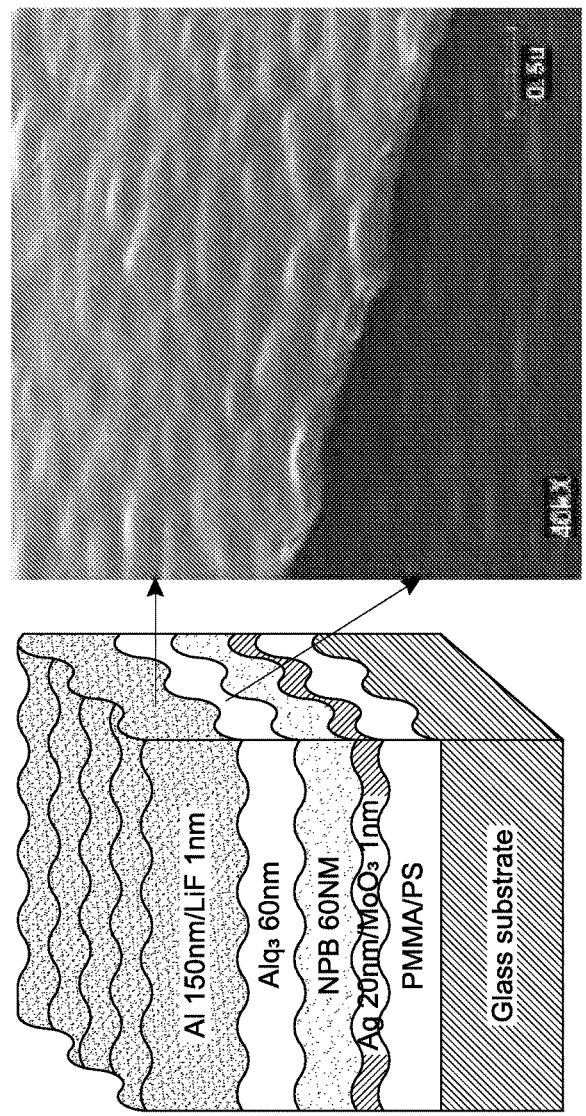

As illustrated in FIGS. 3(a) through 3(d), four OLED structures were prepared to examine the effect of the corrugated light-extracting PMMA/PS polymer layer on electroluminescence performance FIG. 3(a) illustrates an OLED device having an ITO anode but without the polymer layer between the anode and the glass substrate (herein referred to as "ITO device"). FIG. 3(b) illustrates an OLED device having a Ag anode but without the polymer layer between the anode and the glass substrate (herein referred to as "glass device"). FIG. 3(c) illustrates an OLED device having a Ag anode and a planar PMMA layer between the anode and the glass substrate (herein referred to as "planar device"). FIG. 3(d) illustrates an OLED structure having a Ag anode and a corrugated PMMA/PS layer between the anode and the glass substrate (herein referred to as "corrugated device"). The organic layers deposited on the ITO or Ag anode included N,N'-diphenyl-N,N'-bis(1-napthyl-phenyl)-1.1'-biphenyl-4.4'-diamine (NPB) with a thickness of 60 nm and tris-(8-hydroxyquinoline) aluminum (Alq3) with a thickness of 60 nm. The cathode of each device was 150 nm thick of Al. FIG. 3(a) shows a typical ITO anode based OLED. For comparison, the Ag anode having a thickness of 20 nm was deposited directly on the glass substrate (FIG. 3(b)), on the planar PMMA film (FIG. 3(c)) and on the PMMA/PS corrugated film (FIG. 3(d)). FIG. 3(e) shows the SEM image of the Al and Alq3 layers from the corrugated device of FIG. 3(d). The SEM image confirmed that the corrugated morphology was well preserved on each layer of the corrugated device.

Figure 4A:
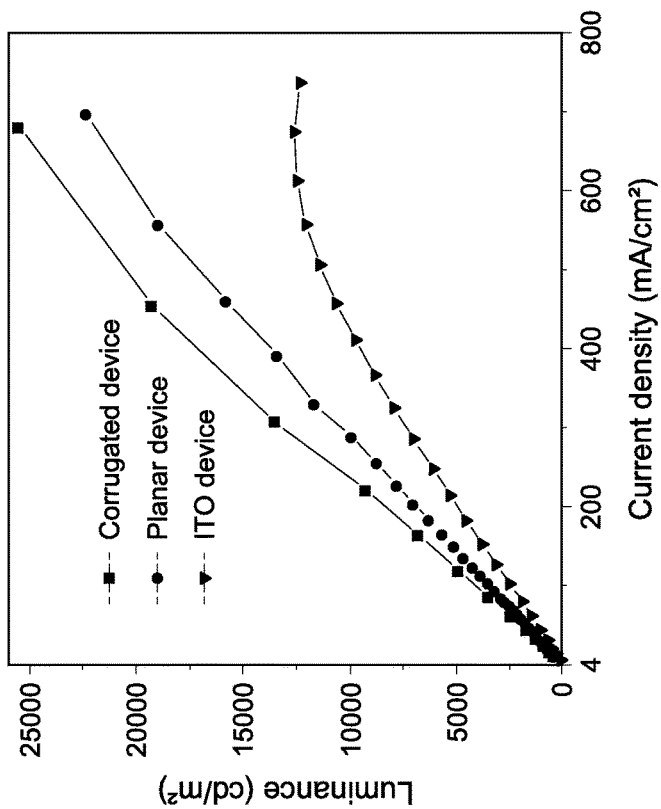
FIGS. 4(a) to 4(d) illustrate current density versus voltage (FIG. 4(a)), luminance vs. current density (FIG. 4(b)), current efficiency versus current density (FIG. 4(c)), and external quantum efficiency (EQE) versus current density (FIG. 4(d)) characteristics of the OLED devices from FIGS. 3(a), 3(c) and 3(d). The square symbols represent the corrugated device of FIG. 3(d), the round symbols represent the planar device of FIG. 3(c), and the triangle symbols represent the ITO device of FIG. 3(a). In addition, FIG. 4 (e) shows a photograph of the glass device of FIG. 3(b) (left) and the corrugated device of FIG. 3(d) (right) at 6 mA.
Figure 4B:
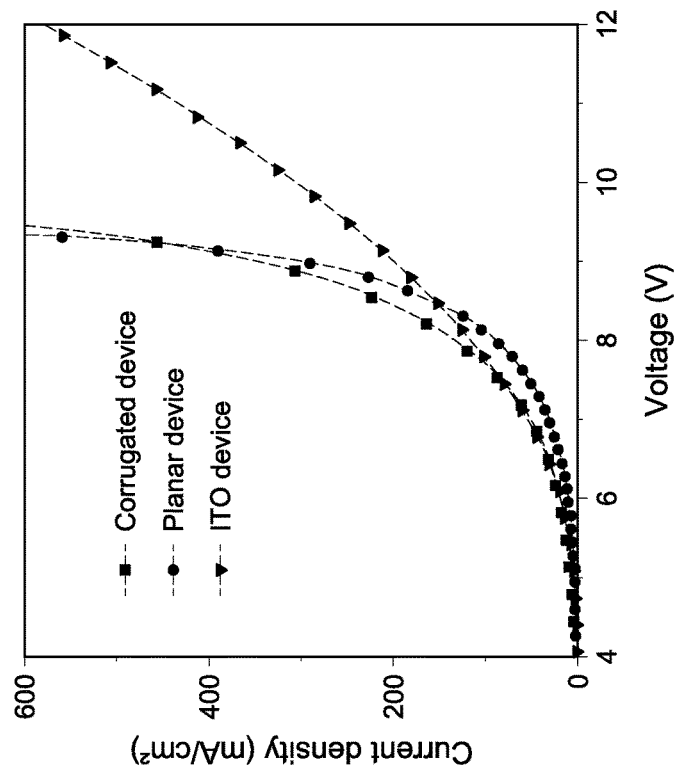
Figure 4C:
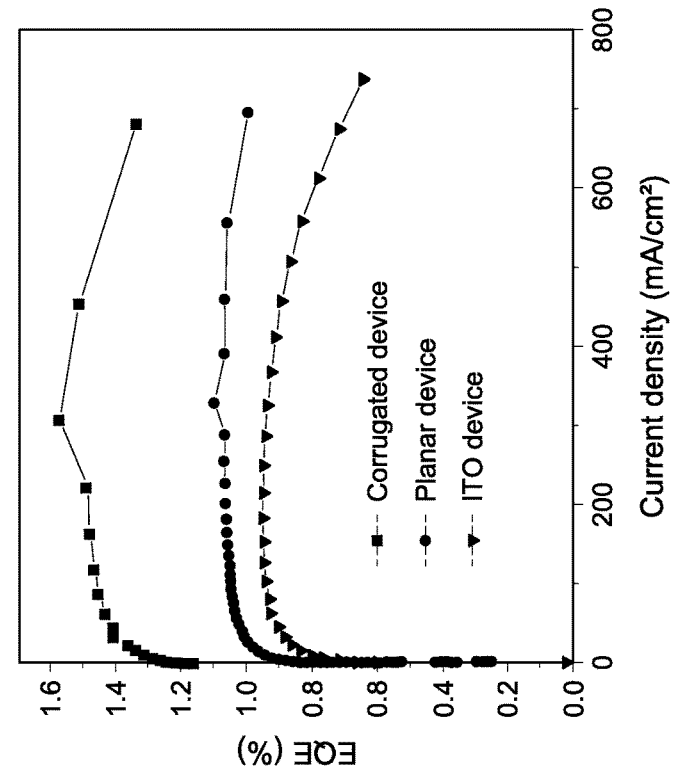

FIG. 4(a) illustrates the current density vs. voltage (J-V) characteristics of the four devices. As shown in FIG. 4(a), the corrugated device has a higher current density than the planar device and the ITO device. The corrugated structure resulted in a large current density due to the presence of elevated and lowered regions. The current density of the ITO device was lower than the planar and corrugated devices in the high voltage region (more than 8V), which was due to an increase in the hole injection from the Ag/$MoO_3$ anode in the planar and corrugated devices, as compared to the ITO anode in the ITO device. FIG. 4(c) shows the efficiency-current density vs. current density characteristics of the devices. The corrugated device showed a significantly higher current efficiency of 4.96 cd $A^{-1}$, while the current efficiency of the glass device, the planar device and the ITO device were respectively 4.07, 3.96 and 2.89 cd $A^{-1}$ at 160 mA $cm^{-2}$.

Figure 4D:
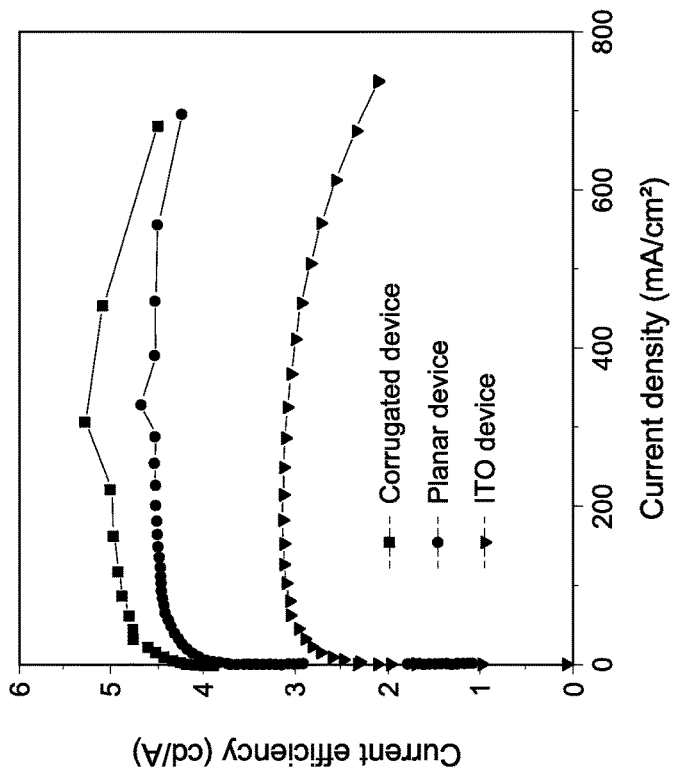
Figure 4E:

The efficiency of corrugated device was enhanced by 72% and 25% compared to the ITO based OLED and the planar PMMA OLED, respectively. In addition, as shown in FIG. 4(b), the maximum luminance of the corrugated OLED was over 25,000 cd $m^{-2}$, which was significantly higher than about 12600 cd $m^{-2}$ for the ITO device and about 22,000 $m^2$ for the planar device. FIG. 4(d) shows the photograph of the glass based planar device (left) and the corrugated PMMA/PS device (right) at the same current 6 mA, and the corrugated OLED appears brighter than the glassed based planner device. This example shows that the PMMA/PS corrugated morphology was well preserved in the OLED structures and the PMMA/PS-based OLED (corrugated device) significantly enhanced current efficiency of the lighting device.

Example 4

Microcavity Optical Model

An optical microcavity was constructed using a thin Ag film anode and a highly reflective Al cathode. The photon density was redistributed so that spontaneous emission intensity of certain wavelengths can be enhanced in a given direction in the microcavity. Typically, the electroluminescence emission spectrum becomes narrow and the peak of the spectrum shifts with the length of the cavity as compared to the non-cavity OLED. The angular dependence to the electroluminescence spectrum was also observed in the microcavity device.

Figure 5:
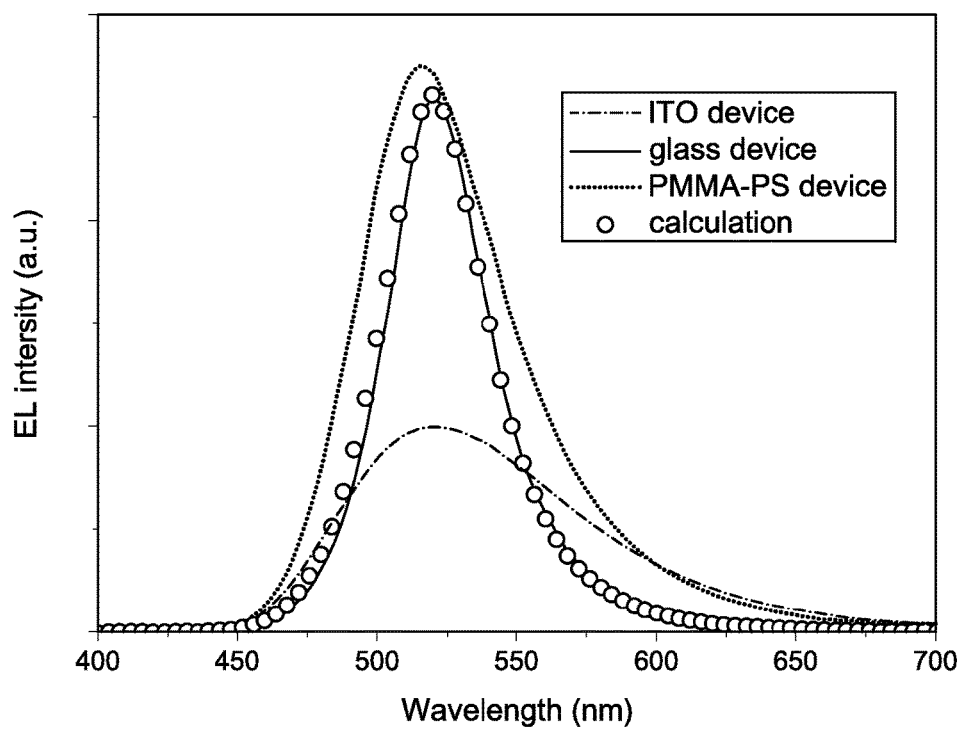
FIG. 5 shows an example of the electroluminescence spectra of the ITO device, the glass device, and the corrugated device from the normal direction. The x-axis is wavelength (nm), and the y-axis is EL intensity (a.u.).

To optimize the Ag anode based device, the emission spectrum of the microcavity was calculated as follow:

$$|E_r(\lambda)|^2 = \frac{(1-R_1)\left[1+R_2+2\sqrt{R_2}\cos\left(\frac{4\pi x}{\lambda}\right)\right]}{1+R_2R_1-2\sqrt{R_2R_1}\cos\left(\frac{4\pi L}{\lambda}\right)}|E_r(\lambda)|^2 \quad \text{(Eq. 1)}$$

Where $|E_r(\lambda)|^2$ is the electroluminescence intensity of microcavity at $\lambda$, $R_1$ and $R_2$ denote the effective amplitude reflection coefficients for a plane wave in the emit layer from the anode and cathode direction, respectively. x is the effective distance from the emitting dipoles to the cathode metal mirror. L is the optical thickness of the cavity. All of the coefficients above can be obtained by transfer matrix method. $|I_e(\lambda)|^2$ is the free space electroluminescence intensity at $\lambda$. The peak of the electroluminescence spectrum shifts with the effective length of the cavity in this optical model. The thickness of the organic films and the Ag anode were set to be 60 nm NPB, 60 nm Alq3 and 20 nm Ag, so that the peak of the electroluminescence spectrum could correspond well with the emitting peak of Alq3. FIG. 5 shows the measured and calculated (circle dot) electroluminescence spectra of the planar device at viewing angle of 0°. The agreement between the experiment and simulation indicates that the emitting spectrum of the device with Ag anode is narrowed significantly by the two metal mirrors. While the full-width at half-maximum was 44 nm for the glass based device and 92 nm for the ITO device, both of the emitting peak of these two devices were 520 nm. Although the glass based device showed an enhancement of about 2.5 at the resonance wavelength, the measured spectrum of glass device had a decrease in the long wavelength region (more than 550 nm) compared to the ITO device, which resulted the enhancement of electroluminescence to be less than the factor of about 2.5 over the ITO device.

A corrugated structure was used to overcome the shortage of the microcavity OLED, such as the narrow electroluminescence spectrum and the angular dependence to the emission spectrum. FIG. 5 shows the electroluminescence spectra of ITO device (dash dot dash line, device of FIG. 3 (a)), planar device (solid line, device of FIG. 3 (b)), and corrugated device (dot line, device of FIG. 3 (d)) from a normal direction. The full-width at half-maximum of planar device in FIG. 3(d) was 64 nm, which was larger than the typical microcavity of the glass based device of FIG. 3(b).

As shown in FIG. 6, the Bragg scattering can be used to understand the broader emission spectra and enhanced EQE of the corrugated micro-cavity OLEDs. FIG. 6(a) shows the 2D AFM image of PMMA-PS film, and the inset image in FIG. 6(a) is the Fast Fourier Transform (FFT) pattern. FIG. 6(b) presents the power spectra from FTTs as a function of grating period (the curved line in the plot) and the relation between the Bragg grating period and the wavelength of the outcoupling light from the normal direction. FIG. 6(c) shows a photo of the planar microcavity OLED (left, device of FIG. 3 (b)) and corrugated microcavity OLED (right, device of FIG. 3 (d)) at 6 mA. FIG. 6(d) shows the intensity enhancement ratio of the PMMA-PS device of FIG. 3 (d) as compared to the glass based device of FIG. 3 (b).

The power lost to waveguide in Ag and organic layers can be extracted by Bragg diffraction gratings with subwavelength periodic structure. The relationship between the wave vector in free space $k_0$ and the wave vector of the in-plane guided mode $k_{wg}$ can be written as $$k_s \sin\theta = k_{wg} \pm nG \quad \text{(Eq. 2)}$$

where θ is the angle of the emitted light, G is the Bragg vector of the grating and n is an integer. Since all of the layers in the corrugated device were corrugated (FIG. 3d), the Bragg scattering structure was expected to recover not only the waveguide mode in organic layers, but also the power lost to Surface Plasmon (SP) in the metal electrode.

The dispersion of SPs can be described as $$k_{SP} = k_0\sqrt{\frac{\varepsilon_m(\omega)\varepsilon_d(\omega)}{\varepsilon_m(\omega)+\varepsilon_d(\omega)}} \quad \text{(Eq. 3)}$$

where $k_0$ describes the vacuum wave vector and $K_{sp}$ is the wave vector of surface plasmons. $\in_m(w)$ and $\in_d(w)$ are the relative permittivity of the metal and the dielectric material. Considering the Eq 2 and Eq 3, the relation between the wavelength of the surface plasmons that could be recovered and the periodic of the grating at normal direction (θ=0° and $k_{SP}=k_{wg}$) is $$\frac{1}{\lambda_0}\sqrt{\frac{\varepsilon_m(\omega)\varepsilon_d(\omega)}{\varepsilon_m(\omega)+\varepsilon_d(\omega)}} = n\frac{1}{d} \quad \text{Eq. (4)}$$

where d is the periodic of the grating. The first order diffraction (n=1) is plotted in red line and the second order diffraction (n=2) is in blue line in FIG. 6 (b). Thus, based on the quasi-periodic distribution and random orientation in the gratings shown in FIG. 6(b), two high enhancement ratios at short and long wavelength under the second order diffraction and first order diffraction are expected, as shown in FIG. 6(d).

Figure 6B:
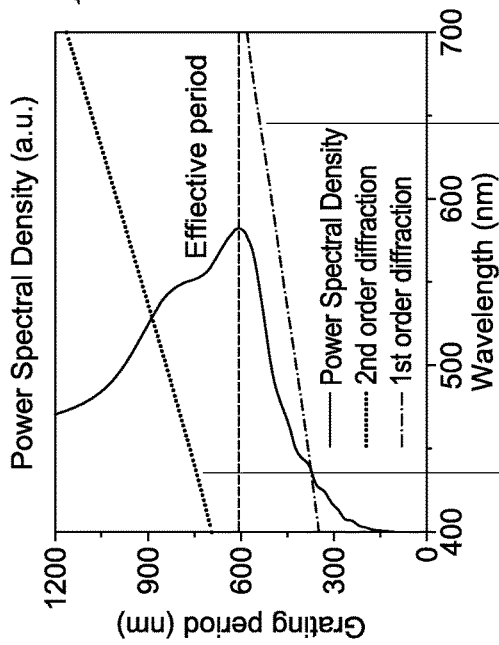
FIGS. 6(a) to 6(d) illustrate non-limiting examples of the characteristics of a corrugated surface and a planar surface.
Figure 6D:
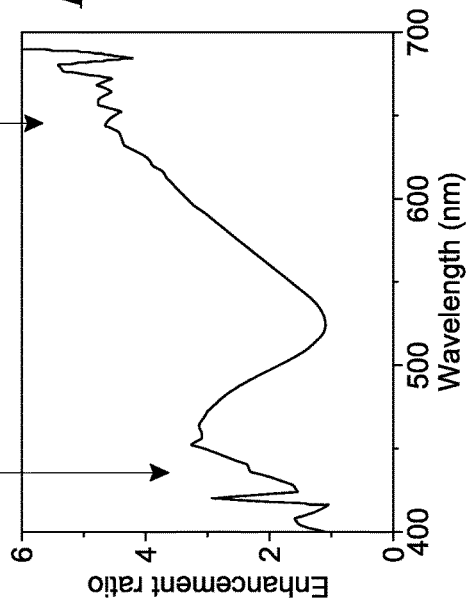
Figure 6A:
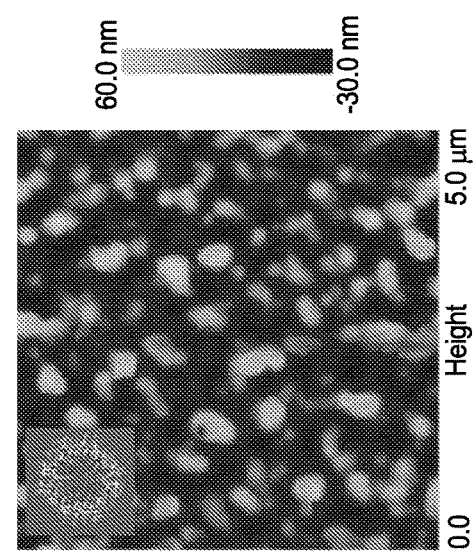
Figure 6C:

The first order diffraction is plotted in the dash dot dash line and the second order diffraction is in the dot line, shown in FIG. 6(b). The power spectral density (PSD) of the PMMA-PS AFM image reveals periodic surface features of the structure and is plotted in figure (dash line) as a function of the period of the grating, as shown FIG. 6(b). The peak wavelength at about 600 nm was expected to be the main grating period of the PMMA/PS structure from the calculated result. Thus, based on the results shown in FIG. 6(b), there are two high outcoupling efficiencies at the emission wavelength of about 425 and about 625 nm, respectively. FIG. 6(b) shows high agreement with the measured result as shown in FIG. 6(d). Thus the electroluminescence spectrum of the corrugated PMMA-PS device is broader than the microcavity PMMA device. This also indicates that the surface morphology of the film has significant effects on the outcoupling efficiencies at different wavelengths. The surface morphology can be adjusted by adjusting the proportion of the PMMA-PS solution, and the desired wavelength where the outcoupling is at its maximum can be obtained. This can be helpful in designing the white light OLEDs.

Figure 7A:
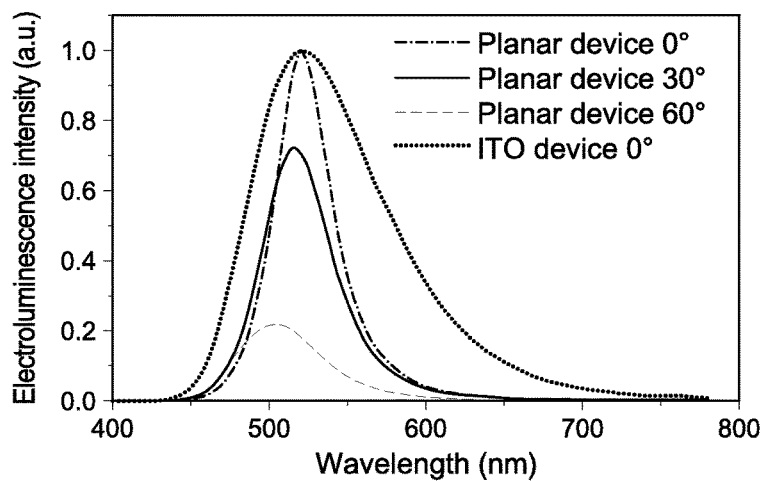
FIGS. 7(a) to 7(c) show non-limiting examples of electroluminescence spectra of the ITO device and the microcavity device at viewing angles of 0°, 30° and 60°.
Figure 7B:
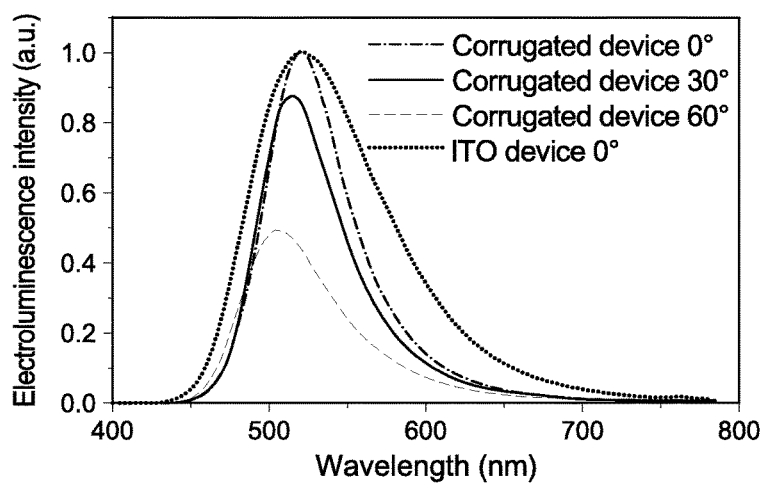
Figure 7C:
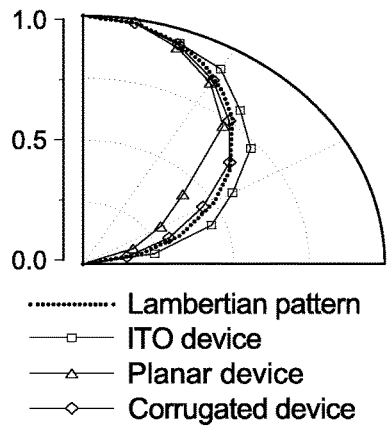

FIGS. 7(a) to 7(c) show electroluminescence spectra of the ITO device (dashed line) and the microcavity device at viewing angles of 0°, 30° and 60°. FIG. 7(a) shows the result without the corrugated structures, and FIG. 7(b) shows the result with the corrugated structures. FIG. 7 (c) shows a Lambertian emission pattern from the corrugated PMMA-PS device.

As shown in FIGS. 7(a) to 7(c), the Bragg diffraction gratings have increased the efficiency of the corrugated PMMA-PS device. The OLED with quasi-periodic nanostructure films showed a broader spectrum than that with flat Ag anode The quasi-periodic nanostructure was prepared through a spin-coating process and the structural parameters can be adjusted by varying the mixing ratio of the solution. The quasi-periodic structure disclosed herein can be fabricated over a large area for white lighting OLED.

With respect to the use of substantially any plural and/or singular terms herein, those having skill in the art can translate from the plural to the singular and/or from the singular to volume of wastewater can be received in the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. Thus, for example, a group having 1-3 articles refers to groups having 1, 2, or 3 articles. Similarly, a group having 1-5 articles refers to groups having 1, 2, 3, 4, or 5 articles, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

What is claimed is:

1. A light-emitting device comprising:
a transparent substrate;
a light-extracting polymer layer having one or more elevated regions and one or more lowered regions distributed on a surface of the light-extracting polymer layer facing away from the transparent substrate, wherein the one or more elevated regions comprise a first material and the one or more lowered regions comprise a second material;
a first electrode layer, wherein the light-extracting polymer layer is disposed between the first electrode layer and the transparent substrate;
a second electrode layer; and
a light-emitting layer disposed between the first electrode layer and the second electrode layer, wherein the light-emitting layer is configured to emit light when a voltage is applied between the first electrode layer and the second electrode layer.

2. The light-emitting device of claim 1, wherein:
the first material of the one or more elevated regions of the light-extracting polymer layer comprises a first thermoplastic polymer; and
the second material of the one or more lowered regions of the light-extracting polymer layer comprises a second thermoplastic polymer.

3. The light-emitting device of claim 2, wherein each of the first thermoplastic polymer and the second thermoplastic polymer is a polycarbonate, an acrylic, a polyolefin, a polyester, a polystyrene, or a copolymer thereof.

4. The light-emitting device of claim 2, wherein:
the first thermoplastic polymer comprises a monomer unit represented by Formula I:

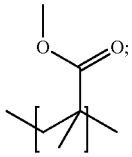

and
the second thermoplastic polymer comprises a monomer unit represented by Formula II:

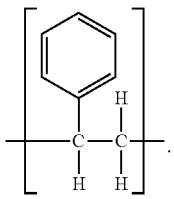

5. The light-emitting device of claim 2, wherein:
the first thermoplastic polymer is polymethyl methacrylate, or a copolymer thereof;
the second thermoplastic polymer is polystyrene, or a copolymer thereof; and
a ratio by weight of the first thermoplastic polymer to the second thermoplastic polymer is about 1:10 to about 10:1.

6. The light-emitting device of claim 1, wherein:
the light-extracting polymer layer has an average thickness of less than about 250 nm;
the one or more elevated regions are periodic structures, quasi-periodic structures or random structures;
the one or more elevated regions are corrugated structures, worm-like structures or a combination thereof;
the one or more elevated regions are nano-sized, micro-sized or a combination thereof;
an average spacing between adjacent elevated regions in the light-extracting polymer layer is less than about 1 µm;
the light-extracting polymer layer has at least $10^8$ elevated regions per square centimeter ($cm^2$);
each of the one or more elevated regions in the light-extracting polymer layer has a height of at least 15 nm;
the transparent substrate comprises ceramic or glass; and
each of the first electrode layer and the second electrode layer comprises silver, gold, indium tin oxide, or a combination thereof.

7. The light-emitting device of claim 1, wherein the transparent substrate has a water contact angle of less than about 80°.

8. The light-emitting device of claim 1, further comprising:
a hole-transport layer disposed between the first electrode layer and the light-emitting layer; or
a hole-injection layer disposed between the first electrode layer and the light-emitting layer.

9. The light-emitting device of claim 8, wherein:
the hole-transport layer comprises N,N'-diphenyl-N,N'-bis(1-naphthyl)-(1,1'-biphenyl)-4,4'-diamine; or
the hole-injection layer comprises molybdenum trioxide.

10. The light-emitting device of claim 1, further comprising:
an electron-injection layer disposed between the second electrode layer and the light-emitting layer; or
an electron-transport layer disposed between the second electrode layer and the light-emitting layer.

11. The light-emitting device of claim 1, wherein the light-emitting layer comprises a phosphorescent material or a fluorescent material.

12. The light-emitting device of claim 1, wherein the light-emitting device has a maximum luminance of at least about 20,000 cd/m$^2$.

13. The light-emitting device of claim 1, wherein at least one of the first electrode layer, the light-emitting layer, or the second electrode layer has one or more elevated regions on a corresponding surface of the first electrode layer, the light-emitting layer, or the second electrode layer that faces away from the transparent substrate.

14. The light-emitting device of claim 1, wherein:
the first material of the one or more elevated regions comprises a first solute included in a solution from which the light-extracting polymer layer is formed; and
the second material of the one or more lowered regions comprises a second solute included in the solution from which the light-extracting polymer layer is formed.

* * * * *

UNITED STATES PATENT AND TRADEMARK OFFICE
CERTIFICATE OF CORRECTION

PATENT NO. : 9,774,004 B2  
APPLICATION NO. : 15/030037  
DATED : September 26, 2017  
INVENTOR(S) : Wu et al.

Page 1 of 1

It is certified that error appears in the above-identified patent and that said Letters Patent is hereby corrected as shown below:

In the Specification

In Column 18, Line 63, delete "22,000 m$^{2}$" and insert -- 22,000 m$^{-2}$ --, therefor.

In Column 19, Line 38, delete "$|e(\lambda)|^2$" and insert -- $|E_r(\lambda)|^2$ --, therefor.

Signed and Sealed this  
Twelfth Day of December, 2017

Joseph Matal  
*Performing the Functions and Duties of the*  
*Under Secretary of Commerce for Intellectual Property and*  
*Director of the United States Patent and Trademark Office*